United States Patent

[11] 3,617,399

[72] Inventor William L. Fowler
Richardson, Tex.

[21] Appl. No. 772,154
[22] Filed Oct. 31, 1968
[45] Patented Nov. 2, 1971

[73] Assignee Texas Instruments Incorporated
Dallas, Tex.

[54] METHOD OF FABRICATING SEMICONDUCTOR POWER DEVICES WITHIN HIGH RESISTIVITY ISOLATION RINGS

9 Claims, 5 Drawing Figs.

[52] U.S. Cl. .......... 148/175, 317/234
[51] Int. Cl. .......... H01l 7/36
[50] Field of Search .......... 148/175

[56] References Cited

UNITED STATES PATENTS

| | | | |
|---|---|---|---|
| 3,150,299 | 9/1964 | Noyce | 317/235 |
| 3,168,422 | 2/1965 | Allegretti et al. | 148/175 |
| 3,172,791 | 3/1965 | Allegretti et al. | 148/175 |
| 3,460,006 | 8/1969 | Strull | 317/235 |
| 2,763,581 | 9/1956 | Freedman | 148/175 |

*Primary Examiner*—L. Dewayne Rutledge
*Assistant Examiner*—E. L. Weise
*Attorneys*—Samuel M. Mims, Jr., James O. Dixon, Andrew M. Hassell, Harold Levine, Melvin Sharp, John M. Harrison and Richards, Harris and Hubbard

ABSTRACT: Improved performance characteristics are possible for semiconductor power devices by encircling the active elements with a high-resistivity isolation ring. Power devices encircled by a high-resistivity isolation ring may be fabricated by a method that includes the step of growing a bar of single-crystal semiconductor material having a radial resistivity varying in a controlled manner from the center thereof. This single crystal bar is then sliced perpendicularly transverse to the longitudinal axis into plane surface wafers of a desired thickness. After various surface preparation techniques, the active regions of the semiconductor power device may be formed in one of the plane surfaces at a desired resistivity section of the slice by photomask and etch techniques. By forming a center section of uniform resistivity encircled by a ring of high-resistivity material, which in turn is encircled by another uniform resistivity area, an integrated circuit may be fabricated on one slice of a single-crystal bar. In these circuits, the power devices would be isolated within the center region by means of the high-resistivity ring.

PATENTED NOV 2 1971 3,617,399

METHOD OF FABRICATING SEMICONDUCTOR POWER DEVICES WITHIN HIGH RESISTIVITY ISOLATION RINGS

This invention relates to semiconductor fabrication, and more particularly to a method for fabricating large area semiconductor power devices within an area of radially controlled resistivity which may or may not be encircled by isolation rings.

Heretofore, in order to fabricate a semiconductor power device, it was necessary to start with a high resistivity silicon slice and subsequently diffuse therein an isolation ring. Alternatively, the isolation rings can be omitted from the silicon slice with an accompanying sacrifice in desired electrical characteristics or fabrication simplicity. Such diffusion processes are difficult and are complicated by normal resistivity variations in the starting material.

Recently, considerable effort has been expended in an effort to perfect techniques for vapor reduction of silicon and germanium halides onto a hot filament to obtain a pure semiconductor crystal in elemental form. Typical of such a technique is that described in the copending application Ser. No. 689,289, assigned to the assignee of the present invention. The technique described in this copending application provides for growing a crystal on a silicon substrate by first hot vapor etching the substrate and then depositing silicon. The hot vapor etching out at about 1,325° C. in an atmosphere of a gaseous mixture containing hydrogen and hydrogen chloride. Following the etching step, silicon is deposited on the filament by exposure to an environment containing hydrogen and trichlorosilane. Following reduction of the hydrogen chloride concentration, the temperature of the filament is lowered to about 1,200° C. Silicon is deposited upon a filament in this manner for a period sufficient to produce a rod of desired diameter.

In accordance with the present invention, the technique described in the above copending application is modified by including a dopant in the environment containing hydrogen and trichlorosilane during the deposition of silicon on the heated filament. This produces a region of controlled resistivity radially extending from the longitudinal axis. After the silicon deposited upon heated filament reaches a desired diameter, the dopant may be varied and the rod exposed to another thermally decomposable vapor source to produce a high-resistivity ring of semiconductor material around the inner core of lower resistivity material.

In accordance with a specific embodiment of this invention, the single-crystal semiconductor bar grown as described in the preceding paragraph is sliced perpendicularly transverse to the longitudinal axis into plane surface wafers of a desired thickness. A semiconductor power device may then be diffused into one of the plane surfaces using a standard photomask and etch technique. The result is a power device fabricated in a low resistivity region and isolated by a high-resistivity ring.

In another embodiment of the present invention, a ring of high-resistivity material encircles an inner ring of lower resistivity material, and in turn is surrounded by an area of lower resistivity material. A semiconductor power device may then be diffused into one of the plane surfaces in the inner ring of a wafer cut from such a semiconductor bar. In the outer lower resistivity region, additional semiconductor devices may be fabricated to form a complete integrated circuit on one wafer.

In accordance with another embodiment of the present invention, the radial resistivity of the grown semiconductor bar is high on the inner and outer areas separated by a lower resistivity ring. A semiconductor power device may then be diffused into the low resistivity ring of a wafer sliced from such a bar.

An object of the present invention is to provide a method for fabricating large area power devices having improved performance characteristics. Another object of the present is to provide a method of fabricating large area power devices encircled by a high-resistivity isolation ring. A further object of the present invention is to provide a method for fabricating large area power devices by uniformly controlling the radial resistivity gradient by a gas doping technique.

A more complete understanding of the invention and its advantages will be apparent from the specification and claims and from the accompanying drawings illustrative of the invention.

Referring to the Drawings:

FIG. 1 schematically illustrates a basic deposition chamber for growing single-crystal semiconductor material;

Figures 1, 2, 3, 4, 5:
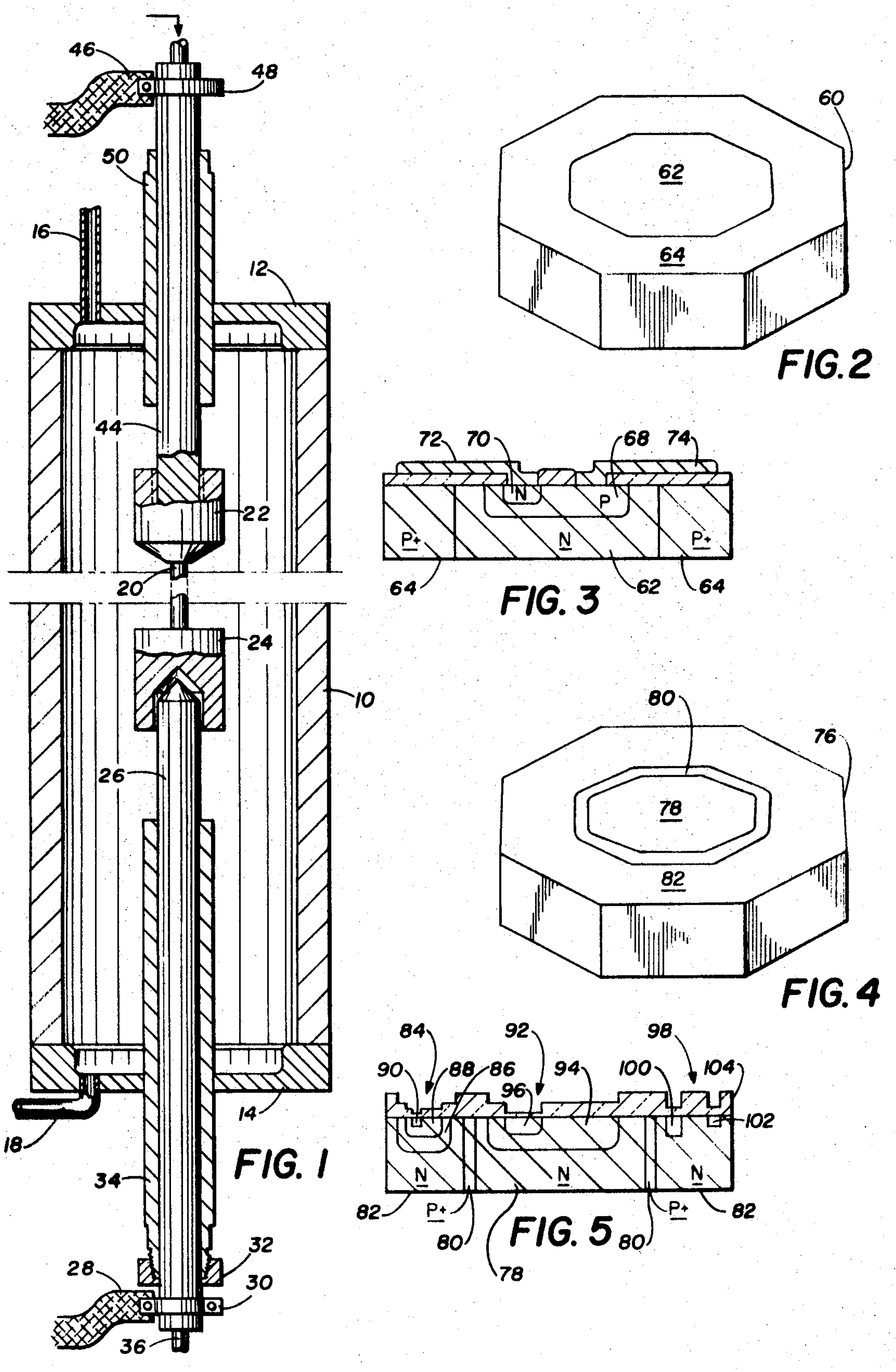
FIG. 2 is an isometric view of a plane surface wafer sliced from a bar of single-crystal semiconductor material.
FIG. 3 is a schematic sectional view illustrating a large area power device fabricated within an isolation ring.
FIG. 4 is an isometric view of a plane surface wafer having a high-resistivity ring separating two lower resistivity regions; and FIG, 5 is a schematic sectional view illustrating an integrated circuit formed in one surface of the wafer of FIG. 4.

Referring initially to FIG. 1, there is shown a typical deposition chamber for the reduction of silicon and germanium halides onto a hot filament to obtain a pure semiconductor single-crystal material in an elemental form. The deposition chamber includes a quartz tube 10 and two end plates 12 and 14. The top end plate has an inlet pipe 16 for admitting reaction gases into the chamber during the etching and crystal growth steps. An outlet pipe 18 is provided in the lower end plate 14 to permit exit of the unused gases. The inlet pipe 16 or the outlet pipe 18 also provides a means for evacuating the deposition chamber to remove absorbed gases at the completion of the etch and deposition phases. Since contamination may come from materials used within the chamber, it is important to select only materials which will withstand the temperatures and reactions gases without giving up contaminants.

The semiconductor filament 20, onto which the silicon or germanium halides are deposited, is supported within the deposition chamber by means of an upper chuck 22 and lower chuck 24. The lower chuck may be of a "slip-chuck" design to provide one means of minimizing stress in the filament as it is heated to the etching and deposition temperatures. Typically, the chucks 22 and 24 are made from a hard graphite material provided with a tapering bore for gripping the ends of the filament.

The lower chuck 24 is slip-fit mounted to an electrode 26 which provides a means for supplying electrical current to the filament 20 for heating thereof. Electrical energy from a source (not shown) is supplied to the chuck 24 through a path that includes a flexible conductor 28 attached to the electrode by means of a ring clamp 30. A compression nut 32 threaded onto a tube 34 provides a means for holding the electrode 26 in an initial position as determined by the length of the filament 20. To maintain the electrode below the temperature at which it gives off contaminants, a stream of water is directed into a center bore by means of a pipe 36. The assembly of the chuck 24, the electrode 26, and the tube 34 is supported by attachment to the lower plate 14.

At the upper end of the deposition chamber, the upper chuck 22 is threaded onto an electrode 44 which provides a means for supplying electrical current to the filament 20 for heating thereof during the etch and deposition phases of the vapor reduction process. The electrode 44 connects to a source of electrical energy (not shown) through a flexible conductor 46 attached to the electrode by means of a ring clamp 48. The electrode 44 is held in position by means of a tube 50 attached to the upper end plate 12.

To position the filament for the vapor reduction process, it is first inserted into the chuck 22 which has been threaded onto the electrode 44. The lower chuck 24 slips over and grips the lower end of the filament 20. With the electrode 26 positioning the chuck as explained previously, a stress-free mounting of the filament is possible. To heat the filament 20 to the etching and deposition temperatures, electrical energy connects thereto through the electrodes 26 and 44.

Current flow is continued until the filament 20 is initially heated to a temperature of the order of about 1,325° C. At this point, a carrier gas, such as hydrogen, is permitted to flow through the inlet pipe 16 and into the interior of the deposition chamber. At this elevated temperature, the substrate is exposed for a period of from 0.5 to 4 minutes to a gaseous mixture containing hydrogen and 20 mole percent (based on the hydrogen) hydrogen chloride after which the substrate is again exposed to the relatively pure hydrogen atmosphere. After exposure to the relatively pure hydrogen atmosphere for 1 to 30 minutes, the substrate is again exposed to a gaseous mixture of hydrogen and 10 mole percent (based on the hydrogen) hydrogen chloride for a period of 15 minutes.

Following the above etching steps, the temperature of the filament 20 is lower to about 1,200° C. to permit thermal decomposition of a vapor source of semiconductor atoms. Presently, the preferred source material for silicon atoms to be used in crystal growth is silicochloroform (trichlorosilane) although other halides such as silicontetrachloride, silicontetrabromide, etc. and silane itself may be employed with appropriate adjustments made in temperature, gas mole ratios, flow rates, etc. Silicon is deposited on the filament 20 for a period of time sufficient to produce a silicon rod of desired diameter.

During this silicon deposition period, active impurity atoms (for example, boron, if P-type material is desired) may be introduced into the silicon rod by means of the gas flow. The impurity material is also in a vapor phase and is a compound which, when subjected to the temperature conditions present at the surface of the silicon starting elements, will decompose and deposit atoms of the active impurity along with atoms of the elemental silicon. It has been found that halides of the active impurity materials provide excellent sources of active impurity material which meets these conditions. To form a P-type semiconductor material, boron trichloride may be used as the active impurity source material and phosphorus trichloride may be used as the active impurity material when forming an N-type layer.

In accordance with the present invention, an active impurity is introduced with the source material to produce a material having a low resistivity. After a predetermined time, the impurity source is cut off and only the source material allowed to continue growth of the crystal. a high-resistivity ring of additional silicon material is now grown around the lower resistivity inner area. Instead of cutting off the dopant after the initial predetermined period of time, the dopant may be varied in concentration or even changed to produce a ring of different resistivity material. Thus, considerable latitude is possible to produce a semiconductor bar having a radial resistivity of a desired configuration.

Additional layers of monocrystalline semiconductor material may be deposited on the thus-formed crystals in a manner similar to that described above. By making appropriate changes in the source of active impurity atoms, either P-type or N-type layers may be grown.

The fabrication of semiconductor devices from the polyhedral crystals formed in accordance with the above description commences by slicing the crystal into plane surface wafers of a desired thickness. Referring to FIG. 2, there is illustrated a plane surface wafer 60 sliced from a crystal having a low resistivity inner area 62 surrounded by a high-resistivity of about 0.2 ohm-cm and the high-resistivity ring 64 has a resistivity of 10–15 ohm-cm.

Large are junctions may be formed in the inner ring 62 by any of the well-known techniques. Referring to FIG. 3, there is shown a schematic sectional view illustrating a large area transistor fabricated into one surface of the wafer 60 using patterned mask and diffusion techniques. All the diffusion steps presently to be described employ conventional techniques in that silicon dioxide is used as a diffusion mask and is patterned using a conventional photolithographic process. Silicon dioxide for each succeeding diffusion step is grown during the preceding diffusion step. Accordingly, the masking process associated with each step will not be described in detail. The first silicon dioxide film is grown by a standard thermo-oxidation process wherein the wafer 60 will be exposed to an atmosphere of steam for 30 minutes while heated to about 1,200° C.

Assuming the inner area of the wafer 60 is an N-type material which will form the collector electrode of a transistor, the next step following the formation of the silicon dioxide film will be the deposition and diffusion of a P-type material forming a base region 68. This is a boron diffusion which may be performed using boron tribromide ($BBr_3$). The deposition is made at 950° C. for a period of 15 minutes and results in an initial sheet resistance of about 60 ohms per square. After a deglaze step, the substrate is placed in a diffusion furnace and heated to 1,200° C. in an oxygen atmosphere for 5 minutes, a steam atmosphere for 20 minutes, and a nitrogen atmosphere for 5 minutes.

Next, the emitter region 70 of the PNP-transistor is diffused; phosphorus oxytrichloride ($POCl_3$) may be used to supply phosphorus for doping the silicon. The deposition is made at 800° C. for about 20 minutes, preceded and followed by 5 minute nitrogen purges, to give a sheet resistance of about 200 ohms per square. After a degaze step, the emitter region 70 is diffused at 1,200° C. for 5 minutes in an oxygen atmosphere, 20 minutes in a steam atmosphere, and 5 minutes in a nitrogen atmosphere.

After all diffusion steps have been completed, a pyrolytic oxide layer having a thickness in the range of from 2,000–3,000 Angstroms is formed over the wafer. This layer may be formed by placing the wafer in a furnace maintained at a temperature of about 450° C. with an oxidant, such as oxygen gas or steam. Openings are now cut in the oxide by a photoresist technique in the areas where ohmic contacts are to be formed. After the wafer has been again cleaned, it is placed in a vacuum evaporation chamber and the ohmic contact metal vaporized onto the wafer by a heated filament. The metallized wafer is gain coated with photoresist, exposed through a mask defining the contacts, and developed. An appropriate etch, such as sodium hydroxide, removes the unwanted metal to define contacts 72 and 74 to the emitter and base region, respectively.

The device now formed in the wafer 60 includes large area junctions for high power applications. The junctions are surrounded by high-resistivity ring 64 which acts as an isolation ring, thereby improving performance characteristics of the device.

In addition to discrete components, complete integrated circuits may be formed on plane surface wafers sliced from a polyhedral shaped crystal grown as explained previously. In integrated circuits, it is desirable to locate the power devices within isolation rings electrically removed from other circuit components.

Referring to FIG. 4, there is shown a plane surface wafer 76 having a low resistivity inner area 78 surrounded by a high-resistivity ring 80 which, in turn, is surrounded by another area 82 of uniform resistivity on the order of the area 78. In FIG. 5 there is illustrated a schematic sectional view of a wafer of the type shown in FIG. 4 including several circuit components of an integrated circuit. In order to fabricate a complete monolithic circuit, any process which is employed must permit the simultaneous fabrication of resistors, diodes, and capacitors. The normal procedure for fabricating resistors is to utilize the base and emitter regions of the transistors, depending on the values of the resistors required for the circuit. In general, these diffused regions must have relatively low sheet resistance values in order to achieve transistors having optimum performance.

The integrated circuit illustrated in FIG. 5 is comprised of an N-type center area 78 and an N-type outer area 82 separated by a P-type high-resistivity ring 80 forming an isolation barrier between the inner and outer areas. A PNP-transistor, indicated generally by the reference numeral 84, is formed by a P-type diffused collector region 86, an N-type diffused base region 88, and a P-type diffused emitter region 90. The inner area of N-tpe material forms the collector region of an NPN-transistor indicated generally by the reference numeral 92. A P-type diffused region 94 forms the base and an N-type diffused region 96 forms the emitter. A diode, indicated generally by the reference numeral 98, is formed by the N-type material of the outer area 82 and a P-type diffused region 100. A heavily doped N-type region of the base material. In FIG. 5, the oxide layer used as a diffusion mask during the fabrication of the circuit is indicated generally by the reference numeral 104 and is illustrated generally as it exists prior to the time that openings are cut in the oxide and the metallized film deposited and patterned to form the contacts of the various components. Although not shown, resistors, capacitors and other electronic components may be fabricated in a wafer of the type illustrated in FIG. 4.

In a modification of the device described above, a plane surface wafer has a high-resistivity inner area surrounded by a low resistivity ring which, in turn, is surrounded by another area of uniform resistivity on the order of the inner area. A large area semiconductor device may now be fabricated in the low resistivity ring by standard photomask and etch techniques.

Another modification includes a series of concentric rings alternating between high and low resistivity. Large area semiconductor power devices may now be fabricated in each of the low resistivity areas. Each such semiconductor device would be isolated from devices in other low resistivity rings.

Although preferred embodiments of the invention have been described in detail, it is to be understood that various changes, substitutions and alterations can be made therein without departing from the spirit and scope of the invention as defined by the appended claims.

What is claimed is:

1. A method of fabricating large area semiconductor power devices comprising:
   - growing a bar of single-crystal semiconductor material having a radial resistivity varying in a controlled manner from the center thereof,
   - slicing said bar perpendicularly transverse to the longitudinal axis thereof into plane surface wafers of a desired thickness, and
   - forming the active regions of a semiconductive power device in one of the plane surfaces of said wafer at a preferred resistivity section.

2. A method of fabricating large area semiconductor power devices as set forth in claim 1 wherein said plane surface wafers have a uniform center resistivity area surrounded by a high-resistivity area forming an isolation ring around a power device formed in center resistivity area.

3. A method of fabricating large area semiconductor power devices comprising:
   - growing a bar of single-crystal semiconductor material from a doped thermally decomposable vapor source to produce a region of desired uniform resistivity,
   - modifying said dopant after the bar has grown to a predetermined size and continuing the bar growth with the modified thermally decomposable vapor source to form a resistivity ring about the center area of different resistivity,
   - slicing said bar perpendicularly transverse to the longitudinal axis thereof into plane surface wafers of a desired thickness, and
   - forming the active regions of a semiconductor power device in one of the plane surfaces of said wafer in a preferred resistivity area.

4. A method of fabricating large area semiconductor power devices as set forth in claim 3 wherein the active regions of the semiconductor power device are formed by a diffusion process.

5. A method of fabricating large area semiconductor power devices as set forth in claim 3 wherein the thermally decomposable vapor source includes a stream of hydrogen gas and trichlorosilane.

6. A method of fabricating an integrated circuit including an isolated power device comprising:
   - growing a bar of single-crystal semiconductor material having a center area of a uniform resistivity surrounded by a ring of different resistivity followed by an outer area of uniform resistivity on the order of said center area,
   - slicing said bar perpendicularly transverse to the longitudinal axis thereof into plane surface wafers of a desired thickness, and
   - forming the active regions of a semiconductor power device in one of the plane surfaces of said wafer in the center area surrounded by said isolation ring and the active regions of other semiconductor devices in the outer area of uniform resistivity.

7. A method of fabricating an integrated circuit including an isolated power device as set forth in claim 6 wherein growing the single-crystal bar of semiconductor material includes the steps of:
   - doping the thermally decomposable vapor source for growing said bar to produce a center area of a desired uniform resistivity,
   - cutting off said dopant after the bar has grown to a predetermined size to form the high-resistivity ring about said center area, and
   - reintroducing the doped thermally decomposable vapor source for growing the outer area of uniform resistivity on the order of said center area.

8. A method of fabricating an integrated circuit including an isolated power device as set forth in claim 6 wherein said active regions are formed by a process of diffusion.

9. A method of fabricating an integrated circuit including an isolated power device as set forth in claim 7 wherein the thermally decomposable vapor source includes a stream of hydrogen containing trichlorosilane.

* * * * *